United States Patent
Kim et al.

(10) Patent No.: US 11,960,755 B2
(45) Date of Patent: Apr. 16, 2024

(54) APPARATUS AND METHOD FOR PERFORMING TARGET REFRESH OPERATION

(71) Applicant: SK hynix Inc., Gyeonggi-do (KR)

(72) Inventors: Woongrae Kim, Gyeonggi-do (KR); Kwi Dong Kim, Gyeonggi-do (KR); Chul Moon Jung, Gyeonggi-do (KR); Jeong Tae Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 309 days.

(21) Appl. No.: 17/549,671

(22) Filed: Dec. 13, 2021

(65) Prior Publication Data

US 2022/0188015 A1    Jun. 16, 2022

Related U.S. Application Data

(60) Provisional application No. 63/125,079, filed on Dec. 14, 2020.

(30) Foreign Application Priority Data

Feb. 3, 2021    (KR) .................. 10-2021-0015548

(51) Int. Cl.
  *G06F 3/06*    (2006.01)
  *G11C 11/406*    (2006.01)
(52) U.S. Cl.
  CPC .......... *G06F 3/0655* (2013.01); *G06F 3/0604* (2013.01); *G06F 3/0673* (2013.01); *G11C 11/406* (2013.01); *G11C 11/40611* (2013.01)

(58) Field of Classification Search
  CPC .... G06F 3/0655; G06F 3/0604; G06F 3/0673; G11C 11/406; G11C 11/40611; G11C 13/0033
  See application file for complete search history.

(56) References Cited

U.S. PATENT DOCUMENTS

| | | | |
|---|---|---|---|
| 9,805,783 B2 * | 10/2017 | Ito | G11C 29/72 |
| 10,943,636 B1 * | 3/2021 | Wu | G11C 11/4085 |
| 11,562,783 B2 * | 1/2023 | Ayyapureddi | G11C 11/4082 |
| 2020/0211623 A1 | 7/2020 | Raad et al. | |
| 2020/0211632 A1 | 7/2020 | Noguchi | |

* cited by examiner

*Primary Examiner* — Idriss N Alrobaye
*Assistant Examiner* — Richard B Franklin
(74) *Attorney, Agent, or Firm* — IP & T GROUP LLP

(57) ABSTRACT

A semiconductor memory device comprises: first storage logic configured to store, as first addresses, 'K' addresses having different values among input addresses applied during the enable period of a reference signal, second storage logic configured to store, as second addresses, 'L' addresses corresponding to a time point at which the enable period of the reference signal is ended among the input addresses, an order controller configured to determine a first output order of each of the first addresses based on a number of times each of the first addresses is repeatedly input, and to determine a second output order for outputting mixed addresses obtained by mixing the first addresses based on the first output order and the second addresses together, and refresh operation logic configured to apply the mixed addresses according to the second output order, to a target refresh operation.

20 Claims, 9 Drawing Sheets

APPARATUS AND METHOD FOR PERFORMING TARGET REFRESH OPERATION

CROSS-REFERENCE TO RELATED APPLICATION

This application claims priority under 35 U.S.C. § 119 to U.S. Provisional Patent Application No. 63/125,079, filed on Dec. 14, 2020, and Korean Patent Application No. 10-2021-0015548, filed on Feb. 3, 2021, which are incorporated herein by reference in their entirety.

BACKGROUND

1. Field

One or more embodiments described herein relate to an apparatus and method that perform refresh operations.

2. Discussion of the Related Art

A volatile memory device stores data in a plurality of memory cells. Each memory cell may include a transistor serving as a switch and a capacitor for storing charge corresponding to the logical value of data. Theoretically, using a capacitor to store data will not consume power. However, in practice, the transistor may experience leakage current, which, in turn, may adversely affect the charge stored in the capacitor. If severe enough, the stored data may be lost.

In an attempt to prevent this problem, data stored in a memory cell may be read before the data is lost and a recharge operation may be performed in an attempt to restore a proper amount of charge corresponding to the read information. In this case, data storage may be maintained only when the recharge operation is periodically repeated. Such a recharge operation may be referred to as a refresh operation, e.g., a normal refresh operation.

In addition to a normal refresh operation, an additional refresh operation (e.g., a target refresh operation) may be performed on a memory cell of a specific word line, which is highly likely to lose data due to a row hammering phenomenon. Row hammering refers to a phenomenon in which data of a memory cell is adversely affected because of frequent activation of a specific or one or more adjacent word lines. In an attempt to prevent row hammering, a target refresh operation may be performed on specific or adjacent word lines that are activated more than a predetermined number of times.

SUMMARY

One or more embodiments described herein provide an apparatus and a method for selecting an address for a target refresh operation.

In accordance with an embodiment of the present invention, a semiconductor memory device, may include: a reference signal generator configured to generate a reference signal having enable periods, wherein a number of the enable periods and length of each enable period are randomly determined based on operation time; first storage logic configured to store, as first addresses, maximum 'K' addresses having different values among input addresses applied during the enable period of the reference signal; second storage logic configured to store, as second addresses, 'L' addresses corresponding to a time point at which the enable period of the reference signal is ended, among the input addresses applied during the enable period of the reference signal; an order controller configured to determine output or non-output and a first output order of each of the first addresses based on a number of times each of the first addresses is repeatedly input, and to determine a second output order for outputting mixed addresses obtained by mixing the first addresses based on the first output order and the second addresses together; and refresh operation logic configured to apply the mixed addresses, which are output by the order controller according to the second output order, to a target refresh operation. 'K' may be a natural number equal to or greater than 2, and 'L' may be a natural number equal to or greater than 1.

In accordance with an embodiment of the present invention, an operation method of a semiconductor memory device, the operation method may include: generating a reference signal having enable periods, wherein a number of the enable periods and length of each enable period are randomly determined based on operation time; storing, as first addresses, maximum 'K' addresses having different values among input addresses applied during the enable period of the reference signal; storing, as second addresses, 'L' addresses corresponding to a time point at which the enable period of the reference signal is ended, among the input addresses applied during the enable period of the reference signal; determining output or non-output and a first output order of each of the first addresses based on a number of times each of the first addresses is repeatedly input, determining a second output order for outputting mixed addresses obtained by mixing the first addresses based on the first output order and the second addresses together; and applying the mixed addresses, which are output according to the second output order, to a target refresh operation. 'K' may be a natural number equal to or greater than 2, and 'L' may be a natural number equal to or greater than 1.

In accordance with the present technology, a plurality of different addresses may be selected and stored in the enable period of a reference signal of which the enable period is randomly determined, an address close to the time point at which the enable period of the reference signal is ended may be additionally selected and stored, and then the selected address may be selected for a target refresh operation.

Furthermore, in accordance with the present technology, an address may be selected for a target refresh operation on the basis of not only the number of accesses to an address but also the time point at which the number of accesses reaches a reference number.

Consequently, there is an effect of more efficiently selecting an address having the highest probability of losing data due to a row hammering phenomenon.

DETAILED DESCRIPTION

Figure 1:
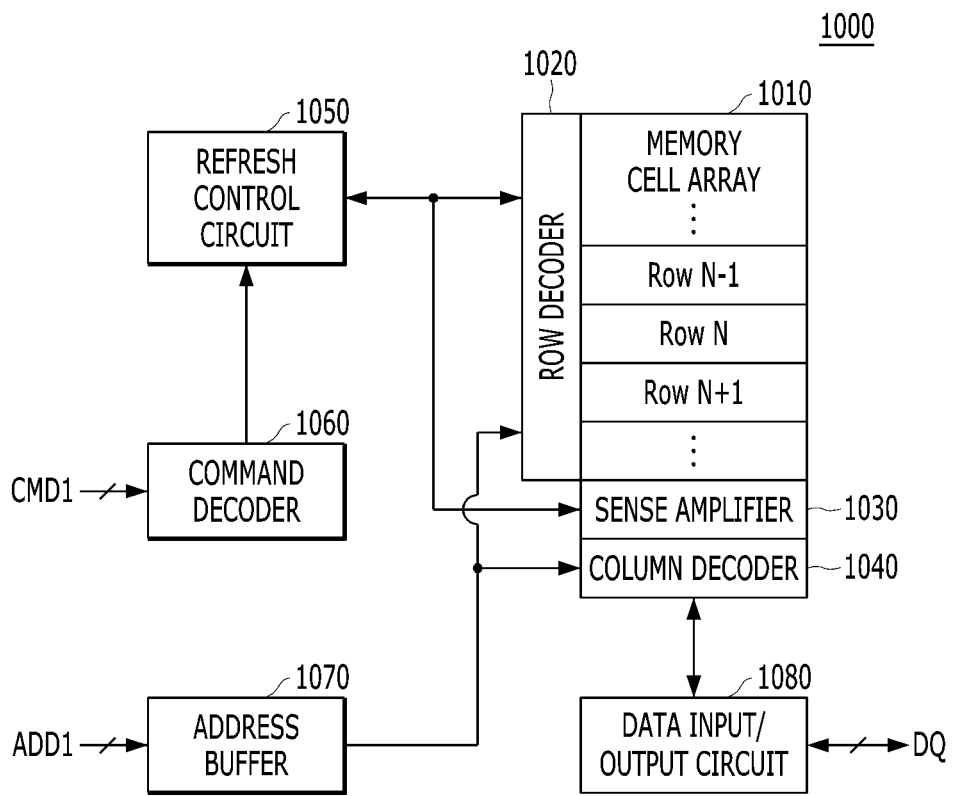
FIG. 1 illustrates an embodiment of a semiconductor memory.

Various examples of the disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete, and fully conveys the disclosure to those skilled in the art to which the invention pertains.

Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may be exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to limit the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention pertains in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a block diagram illustrating an embodiment of a semiconductor memory device 1000, which, for example, may be a DRAM. The memory device 1000 may be a different kind of memory in another embodiment.

Referring to FIG. 1, the semiconductor memory device 1000 includes a memory cell array 1010, a row decoder 1020, a sense amplifier 1030, a column decoder 1040, a refresh control circuit 1050, a command decoder 1060, an address buffer 1070, and a data input/output circuit 1080. The memory cell array 1010 may include memory cells arranged in a row direction and a column direction.

FIG. 1 illustrates an arrangement of memory cells in the row direction. The memory cells may include not only normal cells used for data storage, but also redundancy cells for replacing a memory cell in which an error has occurred. The redundancy cells have substantially the same structure as the normal cells. A redundancy cell array including such redundancy cells may be used as an extra memory area of the memory device 1000.

The command decoder 1060 may receive a command CMD1 from a controller, decode the received command, and internally generate decoded control signals (for example, an active signal, a read signal, a write signal, and/or a refresh signal). The refresh control circuit 1050 may receive the refresh signal from the command decoder 1060 and output a row address to the row decoder 1020 in order to refresh one word line of the memory cell array 1010.

The controller may transmit an address ADD1 for designating a memory cell for writing/reading data to the memory device 1000 together with the command CMD1. The address buffer 1070 may receive the address ADD1 from a control logic, and generate row/column addresses.

The row decoder 1020 may decode the row address, which is output from the refresh control circuit 1050 or the address buffer 1070, in order to designate one word line of the memory cell array 1010. For example, the row decoder 1020 may decode the row address output from the address buffer 1070 during a written/read operation, thereby enabling a word line electrically connected to a memory cell in/from which data is to be written or read. Furthermore, the row decoder 1020 may refresh a corresponding row on the basis of the row address generated from the refresh control circuit 1050.

The sense amplifier 1030 may sense and amplify data of a memory cell electrically connected to the word line designated by the row decoder 1020, and may store data of the memory cell. Furthermore, the column decoder 1040 may decode the column address, which is output from the address buffer 1070, in order to designate a bit line electrically connected to a memory cell to/from which data is to be input or output.

The data input/output circuit 1080 outputs data from a memory cell designated by the address ADD1 in the memory cell array 1010, or inputs data to the memory cell. As a result, the data input through the data input/output circuit 1080 may be written in the memory cell array 1010 on the basis of the address ADD1, or the data read from the memory cell array 1010 may be output to the controller through the data input/output circuit 1080 on the basis of the address ADD1.

When the row decoder 1020 applies a voltage to a word line corresponding to an $N^{th}$ row Row N in order to access the $N^{th}$ row Row N, an electromagnetic field is formed around the word line. When the $N^{th}$ row is frequently accessed, a row hammering phenomenon may occur. According to this phenomenon, data stored in one or more rows adjacent to the $N^{th}$ row (for example, an N−1th row Row N−1 and an N+1th row Row N+1) may be distorted because these rows are continuously being adversely affected by the electromagnetic field.

In an attempt to address this effect, a target refresh operation may be performed on neighboring rows when a certain row is frequently accessed. The goal of performing this operation is to prevent data stored in memory cell array 1010 from being lost due to row hammering.

The controller that controls the memory device 1000 may count the number of accesses for each row of the memory cell array 1010 in order to determine whether the memory cells of the memory cell array 1010 are frequently accessed, e.g., accessed more than a predetermined number of times. As the capacity of a memory system increases, the controller may control a memory pool including a plurality of memory devices 1000. Accordingly, the controller may have to use a relatively large amount of memory resources to count the number of accesses for each row.

Figure 10:
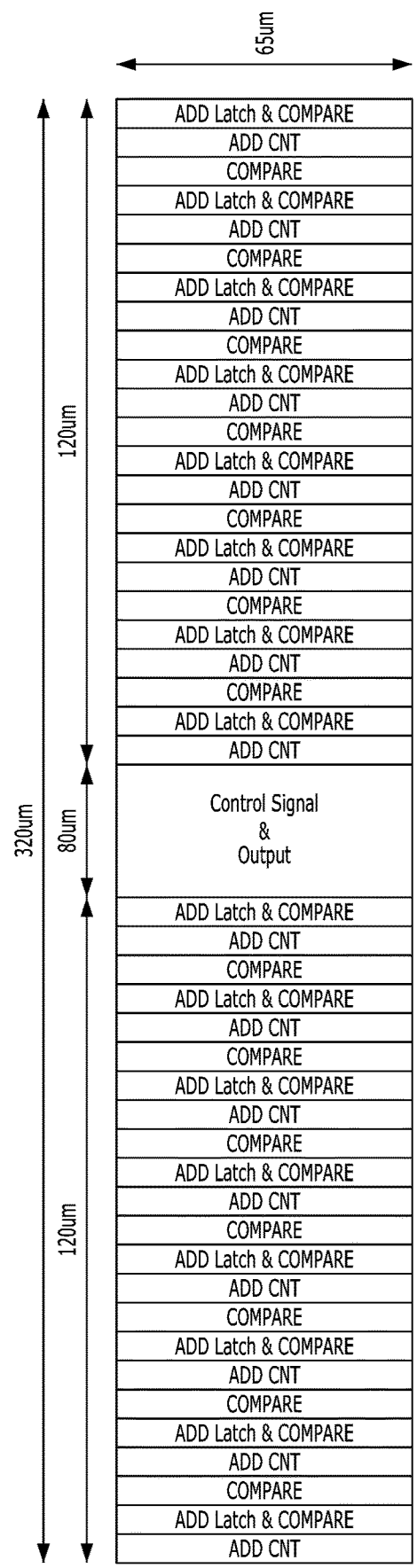
FIG. 10 illustrates one type of address management circuit which has been proposed for performing a target refresh operation.

FIG. 10 illustrates a proposed full count contents address memory (FCCAM) scheme. In this case, the scheme is performed for a memory device that includes 16 address latches ADD Latch & Compare for storing input row addresses, 16 address comparison circuits COMPARE for selecting whether to apply the respective row addresses stored in the 16 address latches to the target refresh operation, and 16 counters ADD CNT. Given these conditions, it may be expected that a large amount of memory resources (320 μm*65 μm) will be used to carry out the scheme.

For example, in the case where 16 row addresses input in a first-come-first-served basis are stored in the address latches of FIG. 10 and the same row address is repeatedly input, a target refresh operation may be applied to the row address if the number of repetitive inputs is counted and exceeds 8K times.

In the proposed scheme, performance of the address latches, the address comparison circuits, and the counters illustrated in FIG. 10 may vary greatly depending on the size of physical resources that can be implemented. For example, 16 different row addresses may be applied to the target refresh operation, but it may not be even possible to check whether to apply more than 16 row addresses to the target refresh operation.

Figure 2:
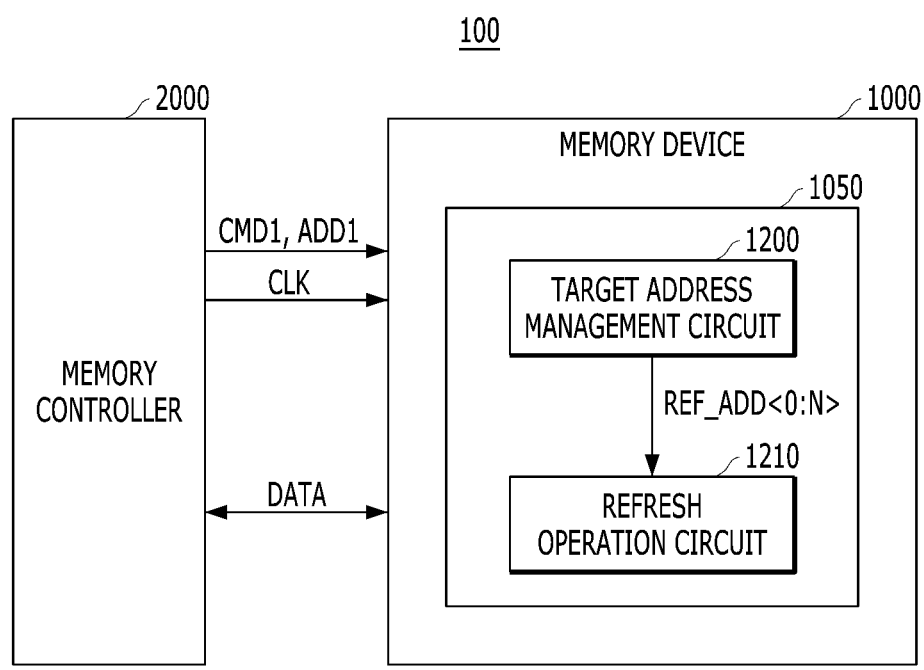
FIG. 2 illustrates an embodiment of a memory system.

FIG. 2 is a diagram schematically illustrating an embodiment of memory system 100, which may include a memory controller 2000 and the memory device 1000, which, for example, may be a semiconductor memory device. The memory controller 2000 and memory device 1000 may include interfaces for mutual communication of commands, data, control signals and/or other information. For example, a command CMD1 may include an access address ADD1 depending, for example, on the type of memory device 1000. The memory controller 2000 may generate the command CMD1 and the access address ADD1 for controlling the memory device 1000, and data DATA may be written in the memory device 1000, or the data DATA may be read from the memory device 1000 under the control of the memory controller 2000.

As described with reference to FIG. 1, the memory device 1000 may include the refresh control circuit 1050 in or coupled to the refresh control circuit 1050 of memory device 1000. The refresh control circuit 1050 may include a target address management circuit 1200 and a refresh operation circuit (i.e., refresh operation logic) 1210.

The target address management circuit 1200 may manage a target address, which is intensively accessed (e.g., greater than a predetermined number of times) among access addresses, for a target refresh operation of the memory device 1000.

The refresh operation circuit 1210 may apply an address REF_ADD<0:N>, which is output to the target address management circuit 1200, for the target refresh operation. The refresh operation circuit 1210 may perform the target refresh operation among operations of the refresh control circuit 1050 for controlling all refresh operations of the semiconductor memory device 1000. For example, the refresh operation circuit 1210 may perform a refresh operation on a preset number of word lines adjacent to a word line that corresponds to the address REF_ADD<0:N> output to the target address management circuit 1200.

As an example, FIG. 2 illustrates that one memory device 1000 is in the memory system 100. In one embodiment, a plurality of memory devices may be in, or coupled to, the memory system 100 based, for example on the intended application. Furthermore, the plurality of memory devices may each be divided into at least one memory module. The memory module may include, for example, a dual in-line memory module (DIMM), an unbuffered dual in-line memory module (UDIMM), a registered dual in-line memory module (RDIMM), a load reduced dual in-line memory module (LRDIMM), a fully buffered dual in-line memory module (FBDIMM), and the like.

Figure 3:
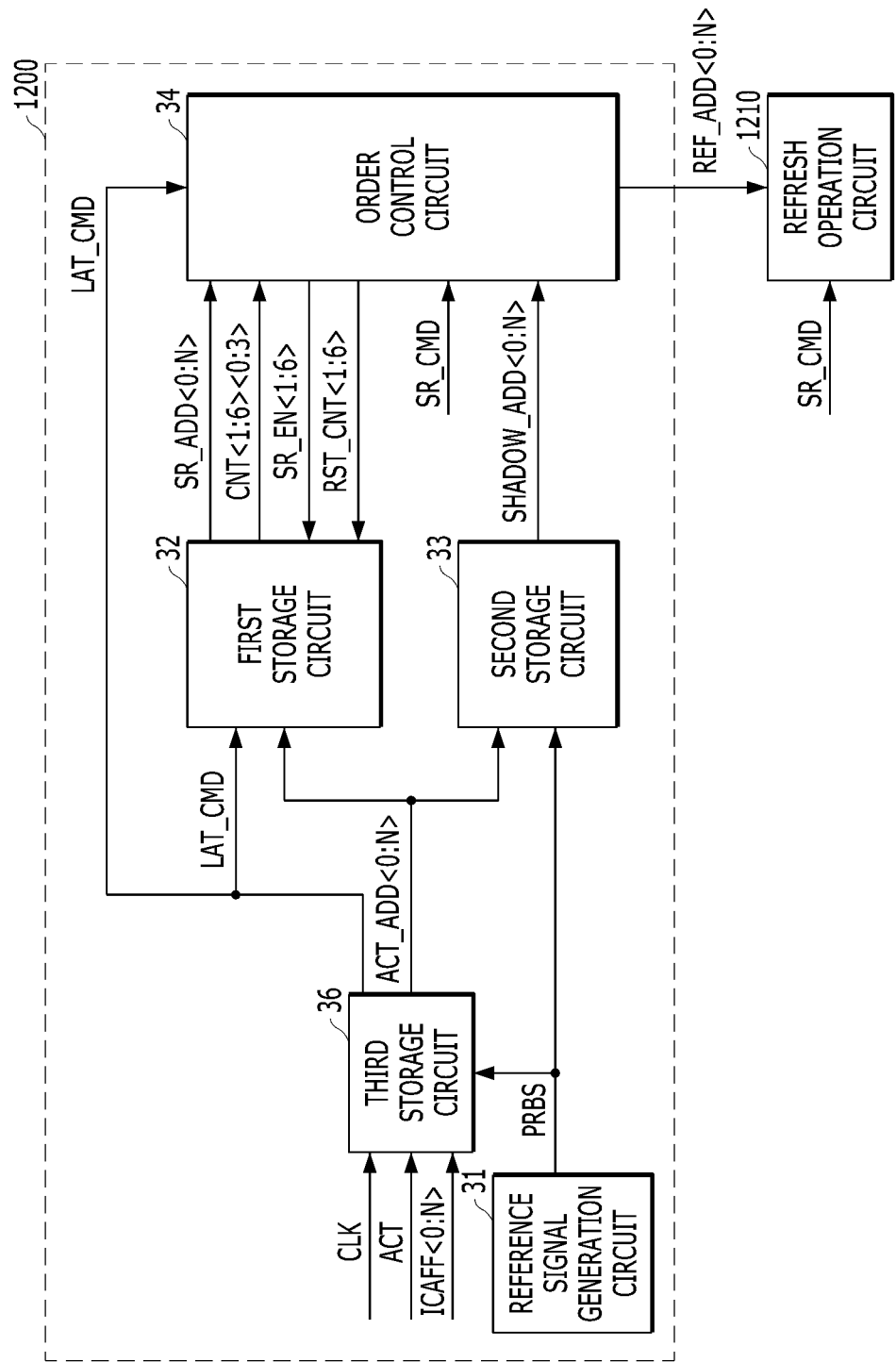
FIG. 3 illustrates an embodiment of a target address management circuit.

FIG. 3 is a diagram schematically illustrating embodiments of the target address management circuit 1200 and the refresh operation circuit 1210, which, for example, may be in refresh control circuit 1050.

Referring to FIG. 3, the target address management circuit 1200 may include a reference signal generation circuit (i.e., a reference signal generator) 31, a first storage circuit (i.e., first storage logic) 32, a second storage circuit (i.e., second storage logic) 33, an order control circuit (i.e., an order controller) 34, and a third storage circuit (i.e., third storage logic) 36.

The reference signal generation circuit 31 may generate a reference signal PRBS of which the number of enable periods and the length of each enable period are randomly determined on the basis of operation time. In one embodiment, operation time may refer to a time for which an operation such as read/write is continuously performed from the time point at which power is supplied to the semiconductor memory device and the operation is started. For example, the reference signal generation circuit 31 may repeatedly generate reference signal PRBS that is enabled at an arbitrary time from the time point at which power is supplied to the semiconductor memory device and the operation is started. The reference signal PRBS may be substantially maintained in the enabled state for an arbitrary time, and then disabled.

The first storage circuit 32 may store, as first addresses SR_ADD<0:N>, maximum K addresses having different values, among input addresses ACT_ADD<0:N> applied during the enable period of the reference signal PRBS. Here, K may be a natural number greater than 2. In accordance with an embodiment, the following description will be given in the example case of where K=6.

The second storage circuit 33 may store, as second addresses SHADOW_ADD<0:N>, L addresses close to the time point at which the enable period of the reference signal PRBS is ended, among the input addresses ACT_ADD<0:N> applied during the enable period of the reference signal PRBS.

The input addresses ACT_ADD<0:N> transferred to each of the first storage circuit 32 and the second storage circuit 33 may correspond to addresses input during the enable period of the reference signal PRBS, among active addresses ICAFF<0:N> input together with active commands ACT. For example, an address input during the disable period of the reference signal PRBS (among the active addresses ICAFF<0:N> input with the active commands ACT) may not be transferred to the first storage circuit 32 and the second storage circuit 33. In an embodiment, the address may include N+1 bits <0:N>, where N is a natural number greater than 1.

The order control circuit 34 may determine the output or non-output and a first output order of each of maximum six first addresses SR_ADD<0:N>, which are stored in the first storage circuit 32. This determination may be based on the number of times CNT<1:6><0:3> by which the respective maximum six first addresses SR_ADD<0:N> stored in the first storage circuit 32 are repeatedly input. The order control circuit 34 may determine a second output order for mixing the maximum six first addresses SR_ADD<0:N> based on the first output order and the second addresses SHADOW_ADD<0:N>, and may output the mixed addresses REF_ADD<0:N> together.

For example, the order control circuit 34 may transfer control signals SR_EN<1:6> and RST_CNT<1:6> to the first storage circuit 32 based on the number of times CNT<1:6><0:3> by which the respective maximum six first addresses SR_ADD<0:N> stored in the first storage circuit 32 are repeatedly input, thereby determining the output or non-output and the first output order of each of the maximum six first addresses SR_ADD<0:N> stored in the first storage circuit 32.

Furthermore, the order control circuit 34 may determine the second output order in order to mix the maximum six first addresses SR_ADD<0:N> stored in the first storage circuit 32 and the second addresses SHADOW_ADD<0:N>. The order control circuit 34 may then output the mixed addresses REF_ADD<0:N> together during output of the maximum six first addresses SR_ADD<0:N>, which are stored in the first storage circuit 32, in a predetermined manner (e.g., at least one-by-one) according to the first output order. Thus, the order control circuit 34 may mix the maximum six first addresses SR_ADD<0:N> based on the first output order and the second addresses SHADOW_ADD<0:N> according to the second output order, and may then output the mixed addresses REF_ADD<0:N> together.

The refresh operation circuit 1210 may apply the addresses REF_ADD<0:N>, which are output by the order control circuit 34 in the target address management circuit 1200 according to the second output order, for the target refresh operation. In one embodiment, the refresh operation circuit 1210 may perform the target refresh operation, among operations of the refresh control circuit 1050, for controlling all refresh operations of the semiconductor memory device 1000, for example, as described with reference to FIG. 2. For example, the refresh operation circuit 1210 may perform a refresh operation on a preset number of word lines adjacent to a word line that corresponds to the addresses REF_ADD<0:N> output to the target address management circuit 1200.

The third storage circuit 36 may receive the active address ICAFF<0:N> applied together with the active commands ACT, output the received address as the input address ACT_ADD<0:N> during the enable period of the reference signal PRBS, and store L input addresses ACT_ADD<0:N> output sequentially from a predetermined time, e.g., the most recent time.

Furthermore, the third storage circuit 36 may output the active command ACT, which is input during the enable period of the reference signal PRBS, as an operation command LAT_CMD. The operation command LAT_CMD may refer to a command input during the enable period of the reference signal PRBS, among the active commands ACT. For example, the command input during the disable period of the reference signal PRBS, among the active commands ACT, may not be output as the operation command LAT_CMD.

Then, the second storage circuit 33 may receive the L input addresses ACT_ADD<0:N> stored in the third storage circuit 36 in response to the end of the enable period of the reference signal PRBS, and may store the received L input addresses ACT_ADD<0:N> as the second addresses SHADOW_ADD<0:N>. The L second addresses SHADOW_ADD<0:N> stored in the second storage circuit 33 may be updated whenever the enable period of the reference signal PRBS is ended, where L is a natural number greater than 1. In accordance with an embodiment, the following description will be given based on the example of where L=1.

Figure 4:
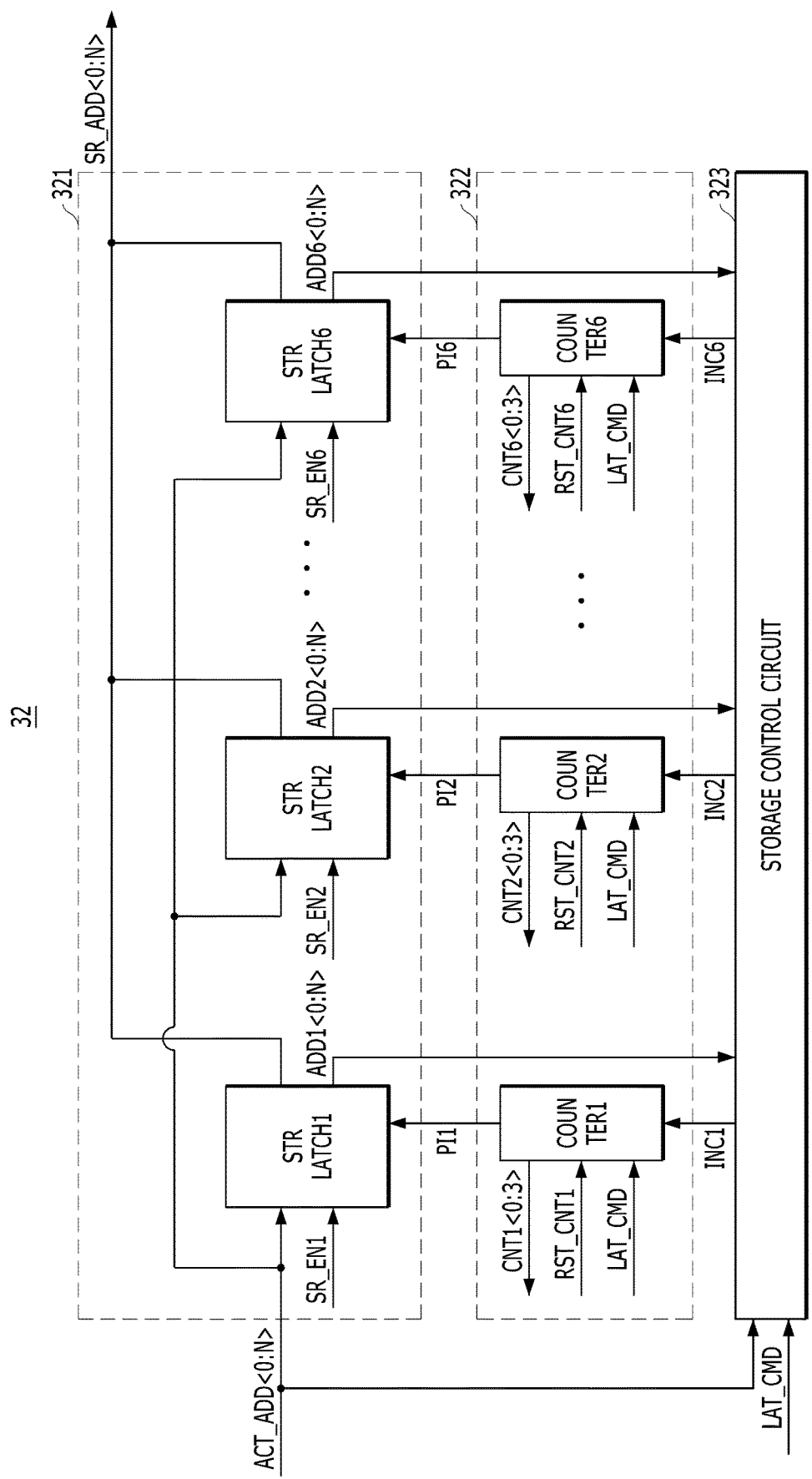
FIG. 4 illustrates an embodiment of a storage circuit.

FIG. 4 is a diagram schematically illustrating an embodiment of the first storage circuit 32, among the components of the target address management circuit 1200 illustrated in FIG. 3.

Referring to FIG. 4, the first storage circuit 32 may include six address latches STR LATCH<1:6>, six counters COUNTER<1:6>, and a storage control circuit (i.e., a storage controller) 323, where the number '6' is determined because K is assumed to be 6 according to an example, as described with reference to FIG. 1. Other values of K may be used in other embodiments, e.g., any natural number equal to or greater than 2 may be selected, for example, based on the intended application.

First, the six address latches STR LATCH<1:6> may store the externally applied input addresses ACT_ADD<0:N> as maximum six first addresses SR_ADD<0:N> or ADD<1:6><0:N> in response to the control signals SR_EN<1:6> or PI<1:6>, respectively. For example, the six address latches STR LATCH<1:6> may store therein the externally applied input addresses ACT_ADD<0:N> as the first addresses SR_ADD<0:N> or ADD<1:6><0:N> in response to the control signals SR_EN<1:6> or PI<1:6>, respectively, and then may output the stored first addresses SR_ADD<0:N> or ADD<1:6><0:N> to an exterior address or location, or the first addresses SR_ADD<0:N> or ADD<1:6><0:N> already stored therein may be deleted. In such a case, as indicated by the word 'maximum', the six address latches STR LATCH<1:6> may receive minimum 0 to maximum six input addresses ACT_ADD<0:N> and may store the received addresses as the first addresses SR_ADD<0:N> or ADD<1:6><0:N>. For example, during an initial operation, the six address latches STR LATCH<1:6> may be in a state in which any of first addresses SR_ADD<0:N> or ADD<1:6><0:N> are not stored.

In FIG. 3, the example of where only 'SR_ADD<0:N>' is used for the 'first addresses' stored in the first storage circuit 32. But, in FIG. 4, 'SR_ADD<0:N>' is used together with 'ADD<1:6><0:N>' for the 'first addresses' stored in the six address latches STR LATCH<1:6> in the first storage circuit 32. This may indicate that maximum six 'first addresses' stored in the six address latches STR LATCH<1:6> may be used for two purposes, namely the purpose of being selected one-by-one in order to be output to outside of the first storage circuit 32 and a purpose of being simultaneously selected for an internal comparison operation.

For example, maximum six 'first addresses' stored in the six address latches STR LATCH<1:6> may be selected one-by-one in response to first control signals SR_EN<1:6> output from the order control circuit 34 and output to the order control circuit 34. In such a case, 'SR_ADD<0:N>' may be indicative of the 'first addresses', e.g., since the 'first address' is output only from one of the six address latches STR LATCH<1:6>, the same reference label 'SR_ADD<0:N>' may be used for all the 'first addresses' output from the respective six address latches STR LATCH<1:6>.

Furthermore, maximum six 'first addresses' stored in the six address latches STR LATCH<1:6> may be simultaneously used for value comparison with the input addresses ACT_ADD<0:N> in the first storage circuit 32, in response to second control signals PI<1:6> output from the six counters COUNTER<1:6>. In such a case, the reference label 'ADD<1:6><0:N>' may be used, e.g., since the 'first addresses' are simultaneously output from the six address latches STR LATCH<1:6>, different reference labels 'ADD<1:6><0:N>' may be used for the 'first addresses' output from the respective six address latches STR LATCH<1:6>.

Thus, since FIG. 3 illustrates only the purpose in which the 'first addresses' stored in the first storage circuit 32 are selected one-by-one for output to the order control circuit 34, it can be seen that only the reference label 'SR_ADD<0:N>' is used. Since FIG. 4 illustrates the purpose in which the 'first addresses' stored in the first storage circuit 32 are selected one-by-one for output to the order control circuit 34 and the purpose in which the six 'first addresses' are simultaneously selected for an internal comparison operation, the reference label 'SR_ADD<0:N>' is used together with the reference numeral 'ADD<1:6><0:N>'.

As an example, the following description will be made using any one of the reference numeral 'SR_ADD<0:N>' and the reference numeral 'ADD<1:6><0:N>' depending on the purpose in which the 'first address' is used.

The six counters COUNTER<1:6> may count six counting values CNT<1:6><0:3> in response to third control signals INC<1:6>, indicating whether maximum six first addresses SR_ADD<0:N> storable in the respective six address latches STR LATCH<1:6> are repeatedly input. The respective six counters COUNTER<1:6> may initialize the internally generated six counting values CNT<1:6><0:3> in response to fourth control signals RST_CNT<1:6> output from the order control circuit 34. The respective six counters COUNTER<1:6> may generate the second control signals PI<1:6> for storing the input address ACT_ADD<0:N> in the respective six address latches STR LATCH<1:6> or for deleting the input address ACT_ADD<0:N> therefrom, in response to the operation command LAT_CMD, the third control signals INC<1:6> output from the storage control circuit 323, and the fourth control signals RST_CNT<1:6> output from the order control circuit 34.

As an example, each of the six counting values CNT<1:6><0:3> are assumed to be 4-bit data <0:3>. The number of bits of data used may be different in another embodiment, for example, based on the intended application.

The storage control circuit 323 may compare the value of the input address ACT_ADD<0:N> with the values of respective maximum six first addresses 'ADD<1:6><0:N>' stored in the respective six address latches STR LATCH<1:6>, and then may selectively store the input addresses ACT_ADD<0:N> in the respective six address latches STR LATCH<1:6> or may selectively increase each of the six counting values CNT<1:6><0:3> generated by the six counters COUNTER<1:6> in response to the comparison result.

For example, when the input address ACT_ADD<0:N> is applied together with the operation command LAT_CMD, the storage control circuit 323 may compare the value of the applied input address ACT_ADD<0:N> with the values of the respective maximum six first addresses 'ADD<1:6><0:N>' stored in the respective six address latches STR LATCH<1:6>. The storage control circuit 323 may then generate the third control signals INC<1:6> in response to the comparison result. The third control signals INC<1:6> generated by the storage control circuit 323 may be transferred to the six counters COUNTER<1:6>, respectively, and used to increase the respective six counting values CNT<1:6><0:3> generated by the six counters COUNTER<1:6> or used to generate the second control signals PI<1:6>.

Furthermore, the second control signals PI<1:6> generated by the storage control circuit 323 may be transferred to the six address latches STR LATCH<1:6>, respectively, and used to select whether to store the operation command LAT_CMD and the input addresses ACT_ADD<0:N> in the respective six address latches STR LATCH<1:6> as the first addresses SR_ADD<0:N> or ADD<1:6><0:N>. The second control signals PI<1:6> generated by the storage control circuit 323 may be transferred to the six address latches STR LATCH<1:6>, respectively, and used to select whether to delete the first addresses SR_ADD<0:N> or ADD<1:6><0:N> already stored therein.

Figure 5:
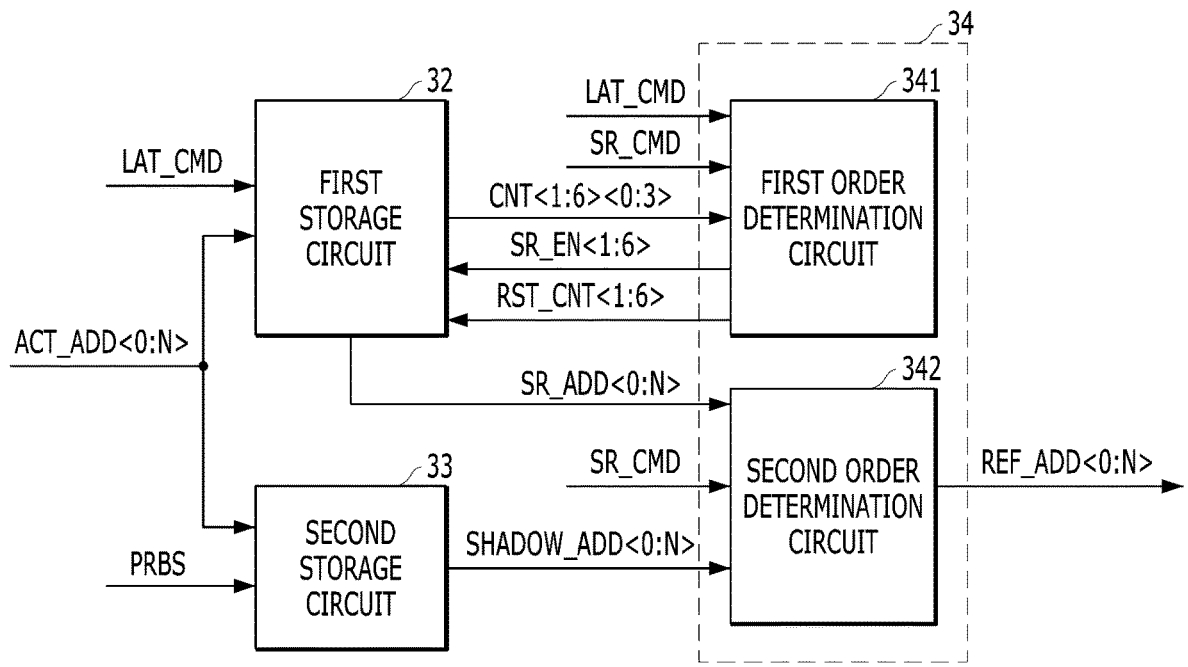
FIG. 5 illustrates an embodiment of an order control circuit.

FIG. 5 is a diagram schematically illustrating an embodiment of the order control circuit 34, which may include a first order determination circuit (i.e., first order determination logic) 341 and a second order determination circuit (i.e., second order determination logic) 342.

In operation, the first order determination circuit 341 may initially determine the output or non-output and the first output order of each of the first addresses SR_ADD<0:N>, according to whether each of the six counting values CNT<1:6><0:3> reaches a reference value and an order in which each of the six counting values CNT<1:6><0:3> reaches the reference value.

For example, until the target refresh operation is performed by the refresh operation circuit 1210 in response to a previous target refresh command SR_CMD and then a next target refresh command SR_CMD is input, the first order determination circuit 341 may select one or more first addresses SR_ADD<0:N> when one or more first counting values has reached the reference value among the six counting values CNT<1:6><0:3>. The one or more first addresses SR_ADD<0:N> may correspond to the one or more first counting values. The first order determination circuit 341 may then put the selected first addresses into the first output order in the order in which the counting values have reached the reference value.

Furthermore, until the target refresh operation is performed and then the next target refresh command SR_CMD is input, the first order determination circuit 341 may randomly select at least one of the maximum six first addresses SR_ADD<0:N> stored in the first storage circuit 32 when none of the six counting values CNT<1:6><0:3> have yet reached the reference value. The first order determination circuit 341 may then put the selected first address into the first output order.

Furthermore, when one or more second counting values (which have never or not reached the reference value) exist among the six counting values CNT<1:6><0:3> while the target refresh command SR_CMD is input a predetermined number of times, the first order determination circuit 341 may delete one or more first addresses SR_ADD<0:N> from the first storage circuit 32. The deleted one or more first addresses SR_ADD<0:N> may correspond to the one or more second counting values.

For example, until the target refresh operation is performed by the refresh operation circuit 1210 and then the next target refresh command SR_CMD is input, whenever the operation command LAT_CMD is applied the first order determination circuit 341 may check whether any of the first counting value have reached the reference value among the six counting values CNT<1:6><0:3> output from the first storage circuit 32. When the result of the check indicates that such a first counting value exists, the first order determination circuit 341 may generate the first control signals SR_EN<1:6> corresponding to the first counting value and may output the generated first control signals SR_EN<1:6> to the first storage circuit 32, in order to select the first addresses SR_ADD<0:N> corresponding to the first counting value. When the check result indicates that a first counting value does not exist, the first order determination circuit 341 may randomly select one of the six counting values CNT<1:6><0:3>, generate the first control signals SR_EN<1:6> corresponding to the randomly selected first counting value, and output the generated first control signals SR_EN<1:6> to the first storage circuit 32 in order to select the first addresses SR_ADD<0:N> corresponding to the randomly selected first counting value.

In one embodiment, after the target refresh operation is performed by the refresh operation circuit 1210, a plurality of operation commands LAT_CMD may be input while the next target refresh command SR_CMD is input. Likewise, after the target refresh operation is performed by the refresh operation circuit 1210, the enable period of the reference signal PRBS may be repeated one or more times while the next target refresh command SR_CMD is input. Accordingly, after the target refresh operation is performed by the refresh operation circuit 1210, one or more first counting values that have reached the reference value may exist among the six counting values CNT<1:6><0:3> output from at least the first storage circuit 32, while the next target refresh command SR_CMD is input.

While the target refresh command SR_CMD is input a predetermined number of times (e.g., while the target refresh operation is performed by the refresh operation circuit 1210 a predetermined number of times), the first order determination circuit 341 may generate the fourth control signals RST_CNT<1:6> when one or more second counting values (having never reached the reference value) exist among the six counting values CNT<1:6><0:3> stored in the first storage circuit 32, which correspond to the one or more second counting values. The first order determination circuit 341 may then output the generated fourth control signals RST_CNT<1:6> to the first storage circuit 32 in order to delete one or more first addresses SR_ADD<0:N> from the first storage circuit 32, which one or more first addresses SR_ADD<0:N> correspond to the one or more second counting values.

Meanwhile, referring to operation of the first storage circuit 32 with reference to FIG. 4, since only one of the six counting values CNT<1:6><0:3> increases in response to one operation command LAT_CMD, it may not be possible for two of the six counting values CNT<1:6><0:3> to simultaneously reach the reference value. Accordingly, the first of the first counting value to reach the reference value may be any one of the six counting values CNT<1:6><0:3>. When a plurality of first counting values have reached the reference value in response to a plurality of operation commands LAT_CMD, the orders in which the respective first counting values reach the reference value are bound to be different from one another.

In this way, when a plurality of first counting values exist, the first order determination circuit 341 may define the first output order in which the respective first counting values reach the reference value. For example, to select a plurality of first addresses SR_ADD<0:N> corresponding to the respective first counting values according to the first output order, the first order determination circuit 341 may generate a plurality of first control signals SR_EN<1:6> corresponding to the plurality of first counting values based on the first output order. The first order determination circuit 341 may then output the generated first control signals SR_EN<1:6> to the first storage circuit 32.

In one embodiment, when a first operation command LAT_CMD is applied, the first order determination circuit 341 may check a first counting value CNT1<0:3> of the six counting values CNT<1:6><0:3> as a first counting value. Subsequently, when a second operation command LAT_CMD is applied, the first order determination circuit 341 may check a third counting value CNT3<0:3> of the six counting values CNT<1:6><0:3> as a first counting value. Subsequently, when a third operation command LAT_CMD is applied, the first order determination circuit 341 may check a second counting value CNT2<0:3> of the six counting values CNT<1:6><0:3> as a first counting value.

In addition, the first order determination circuit 341 may check that fourth to sixth counting values CNT<4:6><0:3>, except for the first to third counting values CNT<1:3><0:3> among the six counting values CNT<1:6><0:3>, have not reached the reference value. In such a case, the first order determination circuit 341 may determine the first to third counting values CNT<1:3><0:3> among the six counting values CNT<1:6><0:3> as outputable counting values, and may not determine the fourth to sixth counting values CNT<4:6><0:3> as outputable counting values.

Furthermore, when determining the first output order for the first to third counting values CNT<1:3><0:3> determined as the outputable counting values, the first order determination circuit 341 may determine the first counting value CNT1<0:3> having reached the reference value firstly as a first order, determine the third counting value CNT3<0:3> having reached the reference value secondly as a second order, and determine the second counting value CNT2<0:3> having reached the reference value thirdly as a third order.

Accordingly, when the first operation command LAT_CMD is applied, the first order determination circuit 341 may generate the first-first control signal SR_EN1 corresponding to the first counting value CNT1<0:3> and may output the generated first-first control signal SR_EN1 to the first storage circuit 32.

Subsequently, when the second operation command LAT_CMD is applied, the first order determination circuit 341 may generate the third-first control signal SR_EN3 corresponding to the third counting value CNT3<0:3> and may output the generated third-first control signal SR_EN3 to the first storage circuit 32.

Subsequently, when the third operation command LAT_CMD is applied, the first order determination circuit 341 may generate the second-first control signal SR_EN2 corresponding to the second counting value CNT2<0:3> and may output the generated second-first control signal SR_EN2 to the first storage circuit 32.

In addition, the second order determination circuit 342 may determine the second output order by dividing the first addresses SR_ADD<0:N> based on the first output order by A and putting B second addresses SHADOW_ADD<0:N> between the divided A first addresses SR_ADD<0:N> based on the number of inputs of the target refresh command SR_CMD input for control of the target refresh operation. Here, A and B may be natural numbers equal to or greater than 1. For example, when A and B are '1', the second order determination circuit 342 may determine the second output order by dividing the first addresses SR_ADD<0:N>, based on the first output order among the maximum six first addresses SR_ADD<0:N> (which are stored in the first storage circuit 32) by one and putting one second address SHADOW_ADD<0:N> for each divided first address SR_ADD<0:N>.

For example, the first control signals SR_EN<1:6> may be sequentially generated and transferred to the first storage circuit 32 according to the first output order (determined through operation of the first order determination circuit 341). The first storage circuit 32 may output the first addresses SR_ADD<0:N> based on the first output order (among the six first addresses SR_ADD<0:N> stored therein) to the second order determination circuit 342. Furthermore, the second storage circuit 33 may output second addresses SHADOW_ADD<0:N> stored therein to the second order determination circuit 342. Accordingly, whenever A target refresh commands SR_CMD are input among the continuously inputted target refresh commands SR_CMD, the second order determination circuit 342 may put A of the first addresses SR_ADD<0:N> based on the first output order into the second output order one by one and output the A first addresses as target refresh addresses REF_ADD<0:N>.

Furthermore, whenever B target refresh commands SR_CMD are input subsequently to the A target refresh commands SR_CMD, the second order determination circuit 342 may put B of the second addresses SHADOW_ADD<0:N> into the second output order one-by-one and output the B second addresses as target refresh addresses REF_ADD<0:N>. For example, the second order determination circuit 342 may put the first addresses SR_ADD<0:N> based on the first output order into the second output order one-by-one and output the put first addresses as target refresh addresses REF_ADD<0:N> in response to the input of an odd-numbered target refresh command SR_CMD. The second order determination circuit 342 may put the second addresses SHADOW_ADD<0:N> into the second output order one-by-one and output the put second addresses as target refresh addresses REF_ADD<0:N> in response to the input of an even-numbered target refresh command SR_CMD.

Figure 6:
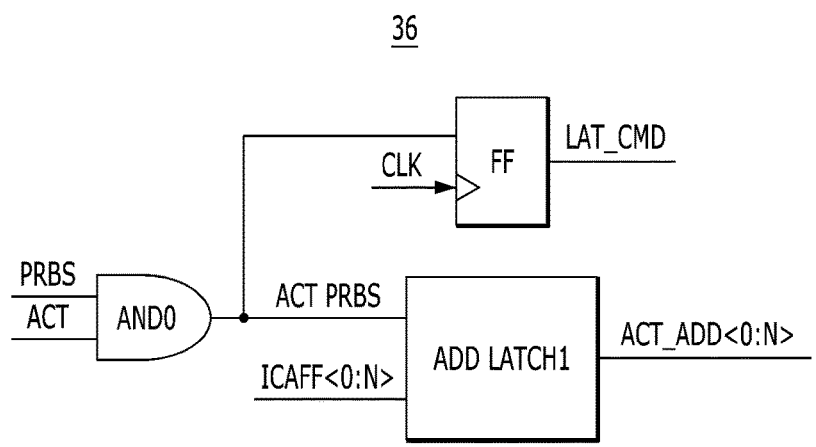
FIG. 6 illustrates an embodiment of another storage circuit.

FIG. 6 is a diagram illustrating an embodiment of the third storage circuit 36, which may include an AND gate AND0, an address latch ADD LATCH1, and a flip-flop FF.

The AND gate AND0 may receive the active command ACT and the reference signal PRBS and perform an AND operation on the active command ACT and the reference signal PRBS. The active command ACT input during the enable period of the reference signal PRBS may be output as an output signal ACT_PRBS of the AND gate AND0.

Then, the address latch ADD LATCH1 may store the active address ICAFF<0:N> in response to the output signal ACT_PRBS of the AND gate AND0, and may output the active address ICAFF<0: N> stored therein as the input address ACT_ADD<0:N>. Accordingly, the address latch ADD LATCH1 may store one active address ICAFF<0:N> input sequentially from the most recent time, e.g., one input address ACT_ADD<0:N> output sequentially from the most recent time.

Then, the flip-flop FF may synchronize the output signal ACT_PRBS of the AND gate AND0 with a clock signal CLK and output the synchronized signal as the operation command LAT_CMD. Accordingly, the active command ACT input during the enable period of the reference signal PRBS among the active commands ACT may be output as the operation command LAT_CMD, and the operation command LAT_CMD may be synchronized with the clock signal CLK.

Figure 7A:
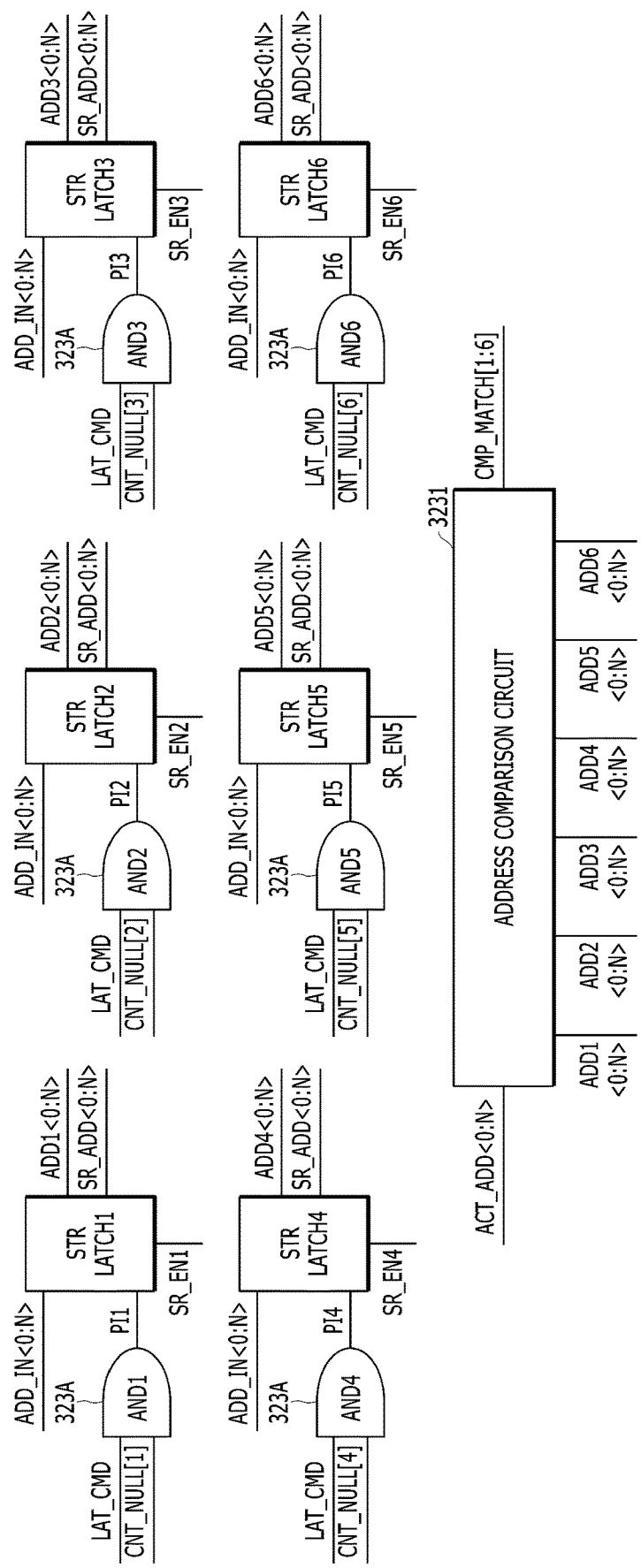
FIGS. 7A and 7B illustrates an embodiment of a storage circuit.
Figure 7B:
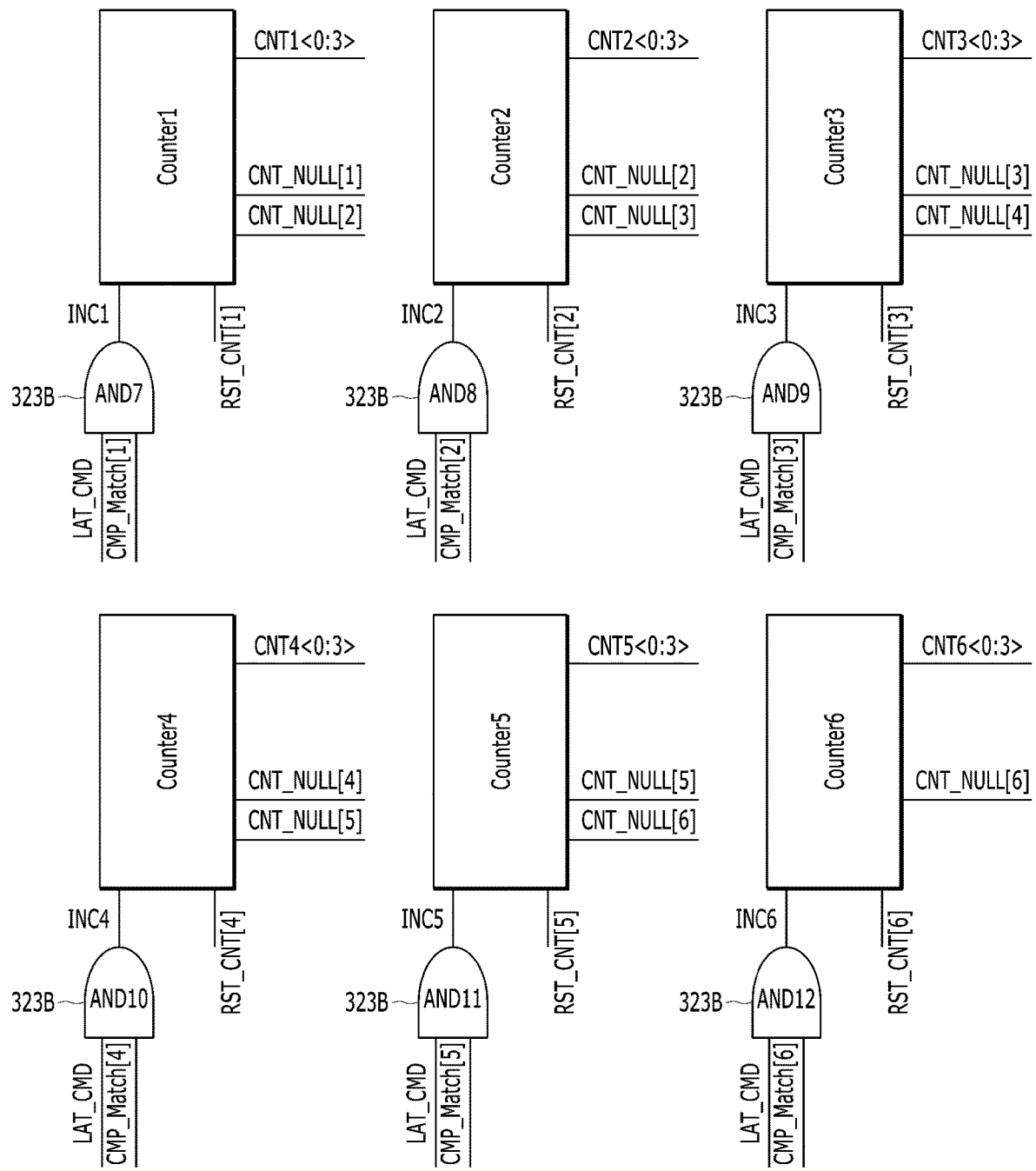

FIGS. 7A and 7B are diagrams illustrating embodiments of the first storage circuit 32 illustrated in FIG. 4. The first storage circuit 32 of FIGS. 7A and 7B may be correspond to the first storage circuit 32 illustrated in FIG. 4, with one or more differences as discussed below.

Referring to FIGS. 7A and 7B, the first storage circuit 32 may include six address latches STR LATCH<1:6>, six counters COUNTER<1:6>, and storage control circuits 3231, 323A, and 323B.

The storage control circuits 3231, 323A, and 323B may include an address comparison circuit (i.e., an address comparator) 3231, a latch control circuit (i.e., a latch controller) 323A, and a counter control circuit (i.e., a counter controller) 323B. In one embodiment, the 'storage control circuit' in the first storage circuit 32 in FIG. 4 may use one reference numeral '323' as one component. In one embodiment, the 'storage control circuit' in the first storage circuit 32 may use three reference numerals '3231, 323A, and 323B' as three components. Accordingly, in one embodiment the 'storage control circuit' in the first storage circuit 32 in FIG. 4 may include three components 3231, 323A, and 323B illustrated in FIGS. 7A and 7B.

For example, the six address latches STR LATCH<1:6> may store therein the externally applied input addresses ACT_ADD<0:N> as the first addresses SR_ADD<0:N> or ADD<1:6><0:N> in response to the second control signals PI<1:6>, respectively. Furthermore, the six address latches STR LATCH<1:6> may output the first addresses SR_ADD<0:N> stored therein to an exterior destination in response to the first control signals SR_EN<1:6>, respectively.

The address comparison circuit 3231 may sequentially compare the value of the input address ACT_ADD<0:N> with the values of the addresses ADD<1:6><0:N> stored in the respective six address latches STR LATCH<1:6>, and may generate six comparison signals CMP_MATCH<1:6> corresponding to the comparison result. For example, the address comparison circuit 3231 may perform an operation of sequentially comparing each of the values of the six first addresses ADD<1:6><0:N> stored in the six address latches STR LATCH<1:6> with the value of the input address ACT_ADD<0:N>, and then may generate the six comparison signals CMP_MATCH<1:6> as a result of the operation.

For example, when the value of the first-first address ADD1<0:N> stored in the first address latch STR LATCH1 among the six address latches STR LATCH<1:6> is the same as the value of the input address ACT_ADD<0:N>, the first comparison signal CMP_MATCH1 among the six comparison signals CMP_MATCH<1:6> may be toggled. Likewise, when the value of the fourth-first address ADD4<0:N> stored in the fourth address latch STR LATCH4 (among the six address latches STR LATCH<1:6>) is the same as the value of the input address ACT_ADD<0:N>, the fourth comparison signal CMP_MATCH4 among the six comparison signals CMP_MATCH<1:6> may be toggled. When all the values of the six first addresses ADD<1:6><0:N> stored in the six address latches STR LATCH<1:6> are different from the value of the input address ACT_ADD<0:N>, none of the six comparison signals CMP_MATCH<1:6> may be toggled.

In addition, when there is no object to be compared with the input address ACT_ADD<0:N> (e.g., when there is a latch in which no address is stored among the six address latches STR LATCH<1:6>), the address comparison circuit 3231 may toggle a comparison signal corresponding to the latch in order to store the input address ACT_ADD<0:N> in the latch, in which no address was previously stored.

For example, when no address is stored in the six address latches STR LATCH<1:6>, the address comparison circuit 3231 may toggle the first comparison signal CMP_MATCH1 such that the input address ACT_ADD<0:N> may be stored in the first address latch STR LATCH1. Likewise, when no address is stored in the sixth address latch STR LATCH6 among the six address latches STR LATCH<1:6> and all the values of the five first addresses ADD<1:5><0:N> stored in the first to fifth address latches STR LATCH<1:5> are different from the value of the input address ACT_ADD<0:N>, the address comparison circuit 3231 may toggle the sixth comparison signal CMP_MATCH6 such that the input address ACT_ADD<0:N> may be stored in the sixth address latch STR LATCH6.

In addition, the counter control circuit 323B may control the counting operation of each of the six counters COUNTER<1:6> in response to each of the six comparison signals CMP_MATCH<1:6>, to thereby adjust the six counting values CNT<1:6><0:3> and the values of six items of count operation information CNT_NULL<1:6> generated in the respective six counters COUNTER<1:6>. For example, the counter control circuit 323B may generate six third control signals INC<1:6> for controlling the counting operation of each of the six counters COUNTER<1:6>, in response to each of the six comparison signals CMP_MATCH<1:6> output from the address comparison circuit 3231 and the operation command LAT_CMD. In one embodiment, the counter control circuit 323B may include six AND gates AND<7:12> for generating the six third control signals INC<1:6> by receiving each of the six comparison signals CMP_MATCH<1:6> and the operation command LAT_CMD and performing an AND operation on each of the six comparison signals CMP_MATCH<1:6> and the operation command LAT_CMD.

Then, the six counters COUNTER<1:6> may generate the six counting values CNT<1:6><0:3> and the six items of count operation information CNT_NULL<1:6> in response to the third control signals INC<1:6> and the fourth control signals RST_CNT<1:6>, respectively.

In addition, the latch control circuit 323A may control the storage operation of each of the six address latches STR LATCH<1:6> in response to each of the six items of count operation information CNT_NULL<1:6>, to thereby selectively store the input address ACT_ADD<0:N> in each of the six address latches STR LATCH<1:6>. For example, the latch control circuit 323A may include six AND gates AND<1:6> for generating the six second control signals PI<1:6> by performing an AND operation on respective ones of the six items of count operation information CNT_NULL<1:6> and the operation command LAT_CMD.

In accordance with an embodiment, the six address latches STR LATCH<1:6>, the six counters COUNTER<1:6>, the address comparison circuit 3231, the counter control circuits 323B, and the latch control circuit 323A in the first storage circuit 32 may operate in the following manner.

First, among the six items of count operation information CNT_NULL<1:6>, first count operation information CNT_NULL1 may be in an active state and the other count operation information CNT_NULL<2:6> may be initialized to an inactive state. Furthermore, each of the six counting values CNT<1:6><0:3> may be initialized to '0', and the six address latches STR LATCH<1:6> may be initialized to a state in which no address is stored.

Thereafter, when the first input address ACT_ADD<0:N> is applied together with the operation command LAT_CMD, the address comparison circuit 3231 may toggle the first comparison signal CMP_MATCH1. Since the first count operation information CNT_NULL1 is in an active state and the first comparison signal CMP_MATCH1 is toggled, the first input address ACT_ADD<0:N> may be stored as first-first addresses ADD1<0:N> in the first address latch STR LATCH1, among the six address latches STR LATCH<1:6>. At this time, the first counter COUNTER1 may increase the first counting value CNT1<0:3> from '0' to '1' in response to the toggling of the first comparison signal CMP_MATCH1, deactivate the first count operation information CNT_NULL1, and activate the second count operation information CNT_NULL2.

Thereafter, when the second input address ACT_ADD<0:N> is applied together with the operation command LAT_CMD, the address comparison circuit 3231 may compare the value of the second input address ACT_ADD<0:N> with the values of the first-first addresses ADD1<0:N> stored in the first address latch STR LATCH1. When the addresses have the same value as the comparison result, the first comparison signal CMP_MATCH1 may be toggled. At this time, since the second count operation information CNT_NULL2 is in an active state, the first counter COUNTER1 may increase the first counting value CNT1<0:3> from '1' to '2' in response to the toggling of the first comparison signal CMP_MATCH1.

When the addresses do not have the same value as the comparison result, the second comparison signal CMP_MATCH2 may be toggled. At this time, since the second count operation information CNT_NULL2 is in an active state and the second comparison signal CMP_MATCH2 is toggled, the second input address ACT_ADD<0:N> may be stored as second-first addresses ADD2<0:N> in the second address latch STR LATCH2 among the six address latches STR LATCH<1:6>. At this time, the second counter COUNTER2 may increase the second counting value CNT2<0:3> from '0' to '1' in response to the toggling of the second comparison signal CMP_MATCH2, deactivate the second count operation information CNT_NULL2, and activate the third count operation information CNT_NULL3.

When a plurality of input addresses ACT_ADD<0:N> are applied together with the operation command LAT_CMD, six input addresses ACT_ADD<0:N> having different values may be stored as six first addresses SR_ADD<0:N> in the six address latches STR LATCH<1:6>. When input addresses ACT_ADD<0:N> having the same value (among the plurality of input addresses ACT_ADD<0:N> applied together with the operation command LAT_CMD) are duplicately input, counting values CNT<1:6><0:3> corresponding to the duplicate input addresses ACT_ADD<0:N> input later may be increased.

Figure 8:
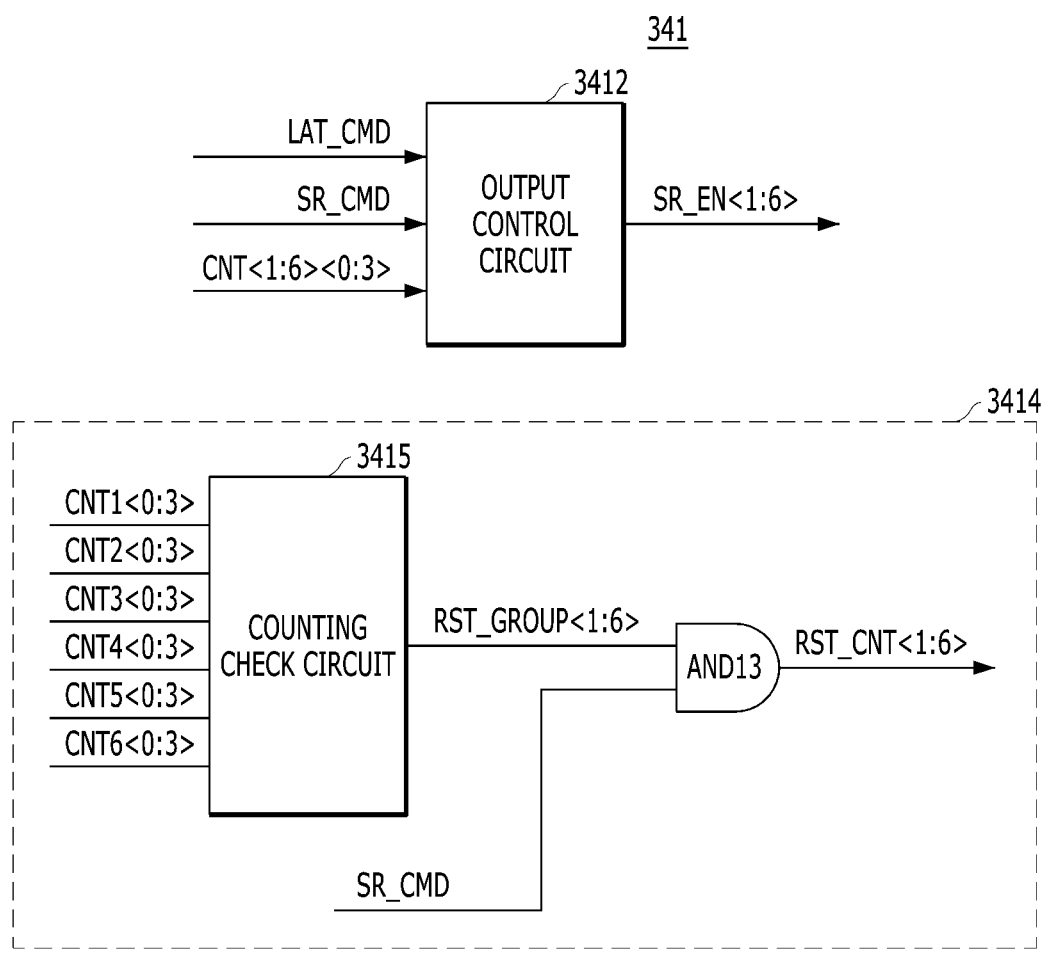
FIG. 8 illustrates an embodiment of a first-order determination circuit.

FIG. 8 is a diagram illustrating an embodiment of the first order determination circuit 341 of the order control circuit 34 of FIG. 5.

Referring to FIG. 8, the first order determination circuit 341 may include an output control circuit (i.e., an output controller) 3412 and a reset control circuit (i.e., a reset controller) 3414. The reset control circuit 3414 may include a counting check circuit 3415 and an AND gate AND13.

The output control circuit 3412 may check whether each of the six counting values CNT<1:6><0:3> reaches the reference value whenever the input address ACT_ADD<0:N> is applied during the enable period of the reference signal PRBS, e.g., whenever the operation command LAT_CMD is input. The output control circuit 3412 may then generate six first control signals SR_EN<1:6> in order to control the output operations of the respective six address latches STR LATCH<1:6>, in response to the target refresh command SR_CMD according to the check result. At this time, the output control circuit 3412 may have information corresponding to the generation order of the six first control signals SR_EN<1:6> stored therein, that is, the first output order. Accordingly, the output control circuit 3412 may generate and output the six first control signals SR_EN<1:6>, one-by-one, whenever the target refresh command SR_CMD is applied.

In addition, the reset control circuit 3414 may check whether a second counting value exists that has not reached the reference value, among the six counting values CNT<1:6><0:3>, while the target refresh command SR_CMD is input a predetermined number of times. The reset control circuit 3414 may then generate six fourth control signals RST_CNT<1:6> to control the reset operations of the respective six counters COUNTER<1:6>, in response to the target refresh command SR_CMD according to the check result.

In addition, after checking whether a second counting value exists that has not reached the reference value while the target refresh command SR_CMD is input the predetermined number of times, the counting check circuit 3415 may generate six reset preparation signals RST_GROUP<1:6> as the check result.

In addition, the AND gate AND13 may receive the six reset preparation signals RST_GROUP<1:6> and the target refresh command SR_CMD, may perform an AND operation on the six reset preparation signals RST_GROUP<1:6> and the target refresh command SR_CMD, and may generate the six fourth control signals RST_CNT<1:6> for controlling the reset operations of the respective six counters COUNTER<1:6> as the execution result of the AND operation.

Figure 9:
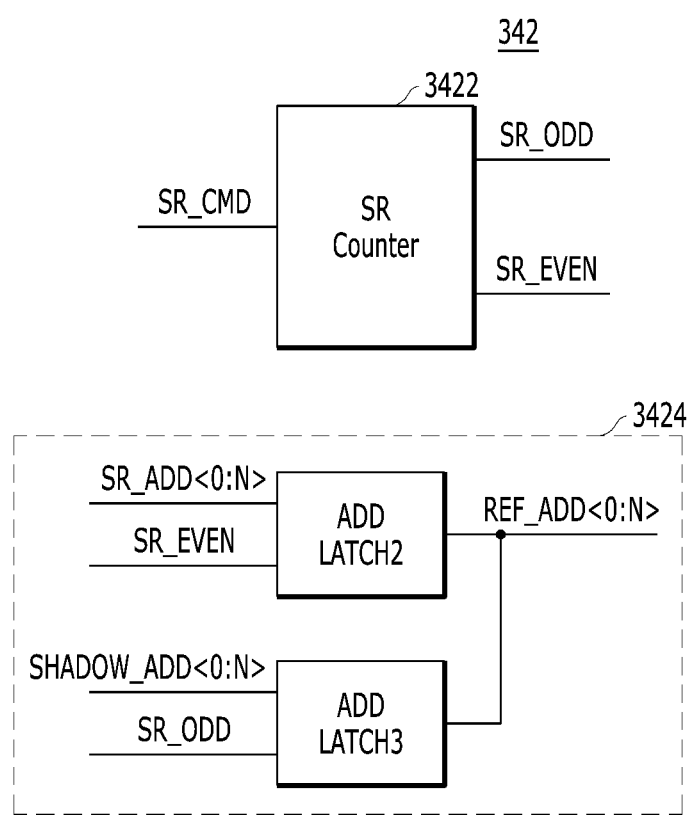
FIG. 9 illustrates an embodiment of a second-order determination circuit.

FIG. 9 is a diagram illustrating an embodiment of the second order determination circuit 342 of the order control circuit 34 illustrated in FIG. 5.

Referring to FIG. 9, the second order determination circuit 342 may include a command counter (SR Counter) 3422 and a refresh address output unit (i.e., refresh address output logic) 3424. The refresh address output unit 3424 may include two address latches ADD LATCH<2:3>.

The SR Counter 3422 may count the number of times by which the target refresh command SR_CMD is input and may divide the target refresh command SR_CMD into an odd-numbered target refresh command SR_CMD_ODD and an even-numbered target refresh command SR_CMD_EVEN.

The refresh address output unit 3424 may output the first addresses SR_ADD<0:N>, which are output from the first storage circuit 32, as the target refresh addresses REF_ADD<0:N> in response to the odd-numbered target refresh command SR_CMD_ODD. The refresh address output unit 3424 may output the second addresses SHADOW_ADD<0:N>, which are output from the second storage circuit 33, as the target refresh addresses REF_ADD<0:N> in response to the even-numbered target refresh command SR_CMD_EVEN.

In addition, the first address latch ADD LATCH2 in the refresh address output unit 3424 may latch the first addresses SR_ADD<0:N>, which are output from the first storage circuit 32, in response to the odd-numbered target refresh command SR_CMD_ODD, and then may output the latched first addresses SR_ADD<0:N> as the target refresh addresses REF_ADD<0:N>.

In addition, the second address latch ADD LATCH3 in the refresh address output unit 3424 may latch the second addresses SHADOW_ADD<0:N>, which are output from the second storage circuit 33, in response to the even-numbered target refresh command SR_CMD_EVEN, and then may output the latched second addresses SHADOW_ADD<0:N> as the target refresh addresses REF_ADD<0:N>.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented in at least partially in software, the controllers, processors, devices, modules, circuits, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The aforementioned embodiments are not limited to the specific examples described above and the accompanying drawings. It will be evident to those skilled in the art to which the present disclosure pertains that various replacements, modifications, and changes can be made without departing from the technical scope of the present disclosure. For example, the position and the type of a logic gate and a transistor in the aforementioned embodiment should be differentially realized according to the polarity of an input signal. The embodiments may be combined to form additional embodiments.

What is claimed is:

1. A semiconductor memory device, comprising:
    a reference signal generator configured to generate a reference signal having enable periods, wherein a number of the enable periods and length of each enable period are randomly determined based on operation time;
    first storage logic configured to store, as first addresses, maximum 'K' addresses having different values among input addresses applied during the enable period of the reference signal;
    second storage logic configured to store, as second addresses, 'L' addresses corresponding to a time point at which the enable period of the reference signal is ended, among the input addresses applied during the enable period of the reference signal;
    an order controller configured to determine output or non-output and a first output order of each of the first addresses based on a number of times each of the first addresses is repeatedly input, and to determine a second output order for outputting mixed addresses obtained by mixing the first addresses based on the first output order and the second addresses together; and
    refresh operation logic configured to apply the mixed addresses, which are output by the order controller according to the second output order, to a target refresh operation,
    wherein 'K' is a natural number equal to or greater than 2, and 'L' is a natural number equal to or greater than 1.

2. The semiconductor memory device of claim 1, further comprising a third storage logic configured to:
    receive an active address input along with an active command during the enable period of the reference signal,
    output the received an active address as an input address among the input addresses, and
    store the 'L' input addresses output sequentially from a most recent time during the enable period of the reference signal.

3. The semiconductor memory device of claim 2, wherein the first storage logic comprises:
    'K' address latches;
    'K' counters corresponding to the 'K' address latches, respectively; and
    a storage controller configured to compare a value of the input address with values stored in the respective K address latches, and, in response to a comparison result, to selectively store the input address in the respective 'K' address latches or selectively increase each of 'K' counting values generated by the 'K' counters.

4. The semiconductor memory device of claim 3, wherein the order controller comprises:
    first order determination logic configured to determine the output or non-output and the first output order of each of the first addresses according to whether each of the 'K' counting values reaches a reference value and an order in which each of the 'K' counting values reaches the reference value; and
    second order determination logic configured to determine the second output order by dividing the first addresses by 'A' and putting 'B' second addresses between the divided 'A' first addresses, based on a number of inputs of a target refresh command input for control of the target refresh operation, wherein 'A' and 'B' are natural numbers equal to or greater than 1.

5. The semiconductor memory device of claim 4, wherein until the target refresh operation is performed and a next target refresh command is input,
    when one or more first counting values having reached the reference value occur among the 'K' counting values, the first order determination logic is configured to select one or more first addresses which correspond to the one or more first counting values, and put the selected first addresses into the first output order in an order in which the counting values have reached the reference value, and
    when none of the 'K' counting values have reached the reference value, the first order determination logic is configured to randomly select at least one of the first addresses and to put the randomly selected first address into the first output order.

6. The semiconductor memory device of claim 5, wherein:
    when one or more second counting values having never reached the reference value exist among the 'K' counting values while the target refresh command is input a predetermined number of times, the first order determination is configured to delete one or more first addresses corresponding to the one or more second counting values from the first storage logic.

7. The semiconductor memory device of claim 6, wherein the first order determination logic comprises:
    an output controller configured to check whether each of the 'K' counting values reaches the reference value when the input address is applied during the enable period of the reference signal, and to control output operations of the respective 'K' address latches in response to the target refresh command according to a check result; and
    a reset controller configured to check whether the second counting value exists among the 'K' counting values, and to control reset operations of the respective 'K' counters in response to the target refresh command according to a check result.

8. The semiconductor memory device of claim 4, wherein the second order determination logic is configured to
    put the first addresses based on the first output order into the second output order, one-by-one, in response to input of an odd-numbered target refresh command, and
    put the second addresses into the second output order, one-by-one, in response to input of an even-numbered target refresh command.

9. The semiconductor memory device of claim 8, wherein the second order determination logic comprises:
    a command counter configured to count a number of times the target refresh command is input and to divide the input target refresh command into the odd-numbered target refresh command and the even-numbered target refresh command; and
    refresh address output logic configured to output the first addresses as target refresh addresses in response to the odd-numbered target refresh command, and to output the second addresses as target refresh addresses in response to the even-numbered target refresh command.

10. The semiconductor memory device of claim 3, wherein the storage controller comprises:
an address comparator configured to sequentially compare the value of the input address with the values of the addresses stored in the respective 'K' address latches and to generate 'K' comparison signals corresponding to a comparison result;
a counter controller configured to control a counting operation of each of the 'K' counters in response to each of the 'K' comparison signals and to adjust the 'K' counting values and values of 'K' items of count operation information generated by the respective 'K' counters; and
a latch controller configured to control a storage operation of each of the 'K' address latches in response to each of the 'K' items of count operation information, to selectively store the input address in each of the 'K' address latches.

11. The semiconductor memory device of claim 2, wherein the second storage logic is configured to:
receive the 'L' input addresses, stored in the third storage logic, in response to end of the enable period of the reference signal, and
store the received 'L' input addresses as the second addresses.

12. An operation method of a semiconductor memory device, the operation method comprising:
generating a reference signal having enable periods, wherein a number of the enable periods and length of each enable period are randomly determined based on operation time;
storing, as first addresses, maximum 'K' addresses having different values among input addresses applied during the enable period of the reference signal;
storing, as second addresses, 'L' addresses corresponding to a time point at which the enable period of the reference signal is ended, among the input addresses applied during the enable period of the reference signal;
determining output or non-output and a first output order of each of the first addresses based on a number of times each of the first addresses is repeatedly input, determining a second output order for outputting mixed addresses obtained by mixing the first addresses based on the first output order and the second addresses together; and
applying the mixed addresses, which are output according to the second output order, to a target refresh operation,
wherein 'K' is a natural number equal to or greater than 2, and 'L' is a natural number equal to or greater than 1.

13. The operation method of claim 12, further comprising:
receiving an active address input along with an active command during the enable period of the reference signal,
outputting the received active address as an input address among the input addresses, and
storing the 'L' input addresses output sequentially from a most recent time during the enable period of the reference signal.

14. The operation method of claim 13, wherein the storing of the maximum 'K' addresses comprises:
managing maximum 'K' counting values to manage a number of times each of maximum 'K' first addresses is repeatedly input;
comparing a value of the input address with a value of each of the first addresses; and
newly storing the input address as the first addresses or increasing a counting value corresponding to one of the first addresses, in response to a result of the comparison.

15. The operation method of claim 14, wherein the determining of the output or non-output and the first output order of the first addresses comprises:
(a) determining the output or non-output and the first output order of each of the first addresses, managed during management counting, according to whether each of the counting values of the first addresses reaches a reference value and an order in which each of the counting values reaches the reference value; and
(b) determining the second output order by dividing the first addresses by 'A' and putting 'B' second addresses between the divided 'A' first addresses, based on a number of inputs of a target refresh command input for control of the target refresh operation, wherein 'A' and 'B' each are a natural number equal to or greater than 1.

16. The operation method of claim 15, wherein the operation (a) comprises:
until the target refresh operation is performed and a next target refresh command is input, one or more first addresses which correspond to one or more first counting values when the one or more first counting values having reached the reference value occur, among the managed counting values of the first addresses, and putting the selected first addresses into the first output order in the order in which the counting values have reached the reference value, and
randomly selecting at least one of the first addresses, when none of the managed counting values of the first addresses have reached the reference value, and putting the selected first address into the first output order.

17. The operation method of claim 16, wherein the operation (a) further comprises:
when one or more second counting values having never reached the reference value exist among the counting values of the first addresses managed during management counting while the target refresh command is inputted a predetermined number of times, deleting one or more first addresses corresponding to the one or more second counting values.

18. The operation method of claim 15, wherein the operation (b) comprises:
putting the first addresses based on the first output order into the second output order, one-by-one, in response to input of an odd-numbered target refresh command, and
putting the second addresses into the second output order, one-by-one, in response to input of an even-numbered target refresh command.

19. The operation method of claim 18, wherein the operation (b) comprises:
counting a number of times the target refresh command is input and dividing the input target refresh command into the odd-numbered target refresh command and the even-numbered target refresh command; and
outputting the first addresses as target refresh addresses in response to the odd-numbered target refresh command, and outputting the second addresses as target refresh addresses in response to the even-numbered target refresh command.

20. The operation method of claim 13, wherein the storing of the 'L' addresses comprises:

receiving the stored 'L' input addresses in response to end of the enable period of the reference signal, and storing the 'L' addresses as the second addresses.

\* \* \* \* \*